US012191204B2

United States Patent
Nakamura

(10) Patent No.: US 12,191,204 B2
(45) Date of Patent: *Jan. 7, 2025

(54) METHOD OF PROCESSING WAFER AND PROCESSING APPARATUS FOR WAFER

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 413 days.

This patent is subject to a terminal disclaimer.

(21) Appl. No.: 17/657,432

(22) Filed: Mar. 31, 2022

(65) Prior Publication Data
US 2022/0336282 A1 Oct. 20, 2022

(30) Foreign Application Priority Data
Apr. 14, 2021 (JP) .................. 2021-068188

(51) Int. Cl.
*H01L 21/78* (2006.01)
*H01L 21/67* (2006.01)

(52) U.S. Cl.
CPC ........ *H01L 21/78* (2013.01); *H01L 21/67092* (2013.01)

(58) Field of Classification Search
CPC .......................... H01L 21/78; H01L 21/67092
USPC .................................................. 438/463, 113
See application file for complete search history.

(56) References Cited

U.S. PATENT DOCUMENTS

| | | | |
|---|---|---|---|
| 2009/0170289 A1* | 7/2009 | Furuta .................... | B23K 26/40 257/E21.238 |
| 2012/0214278 A1* | 8/2012 | Nakata .................. | H01L 21/304 257/E21.24 |
| 2013/0183811 A1* | 7/2013 | Kobayashi .............. | B24B 7/228 438/463 |
| 2014/0094019 A1* | 4/2014 | Furuta .................... | H01L 21/78 438/463 |

(Continued)

FOREIGN PATENT DOCUMENTS

| | | |
|---|---|---|
| JP | 2002192370 A | 7/2002 |
| JP | 2018098294 A | 6/2018 |
| JP | 2018125454 A | 8/2018 |

OTHER PUBLICATIONS

Search report issued in counterpart Singapore patent application No. 10202203397S, dated Jul. 18, 2023.

*Primary Examiner* — Nitin Parekh
(74) *Attorney, Agent, or Firm* — Greer, Burns & Crain, Ltd.

(57) ABSTRACT

A method of processing a wafer to divide the wafer into individual device chips, includes a second modified layer forming step of applying a laser beam to the wafer while positioning a focused spot of the laser beam inside the wafer along the projected dicing lines extending in a second direction intersecting with a first direction, thereby forming second modified layers in the wafer along the projected dicing lines extending in the second direction. In the second modified layer forming step, when the focused spot of the laser beam along the projected dicing lines extending in the second direction reaches first modified layers, the focused spot of the laser beam is shifted along the first modified layers to thereby undulate the laser beam in a staggered pattern to prevent the second modified layers from being (Continued)

formed straight in the wafer along the projected dicing lines extending in the second direction.

3 Claims, 5 Drawing Sheets

(56) References Cited

U.S. PATENT DOCUMENTS

| | | | |
|---|---|---|---|
| 2014/0206177 A1* | 7/2014 | Ogawa | B23K 26/40 |
| | | | 438/462 |
| 2015/0038057 A1* | 2/2015 | Tamenori | B32B 37/1207 |
| | | | 156/212 |
| 2018/0151508 A1* | 5/2018 | Nakamura | H01L 21/78 |
| 2018/0161921 A1* | 6/2018 | Morikazu | H01L 31/202 |
| 2018/0200830 A1* | 7/2018 | Yodo | B23K 26/57 |
| 2018/0204771 A1* | 7/2018 | Morikazu | B23K 26/53 |
| 2019/0164832 A1* | 5/2019 | Ueki | B23K 26/083 |
| 2019/0389008 A1* | 12/2019 | Furuta | B23K 26/0648 |
| 2020/0335377 A1* | 10/2020 | Masuda | H01L 21/67092 |
| 2020/0381303 A1* | 12/2020 | Hoshino | H01L 21/268 |

* cited by examiner

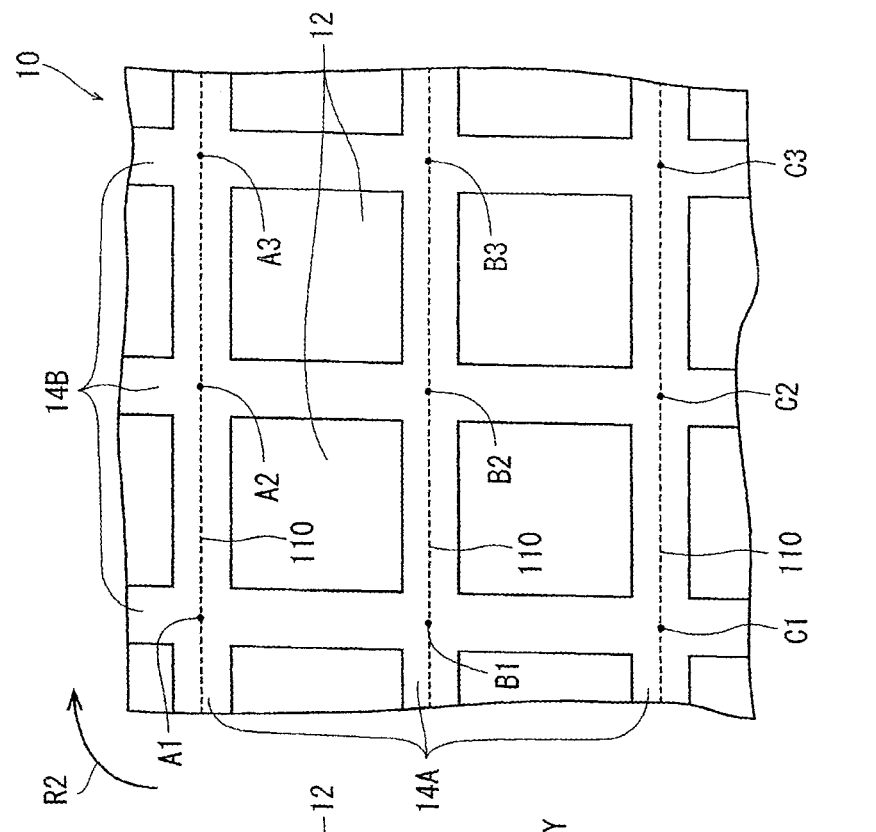

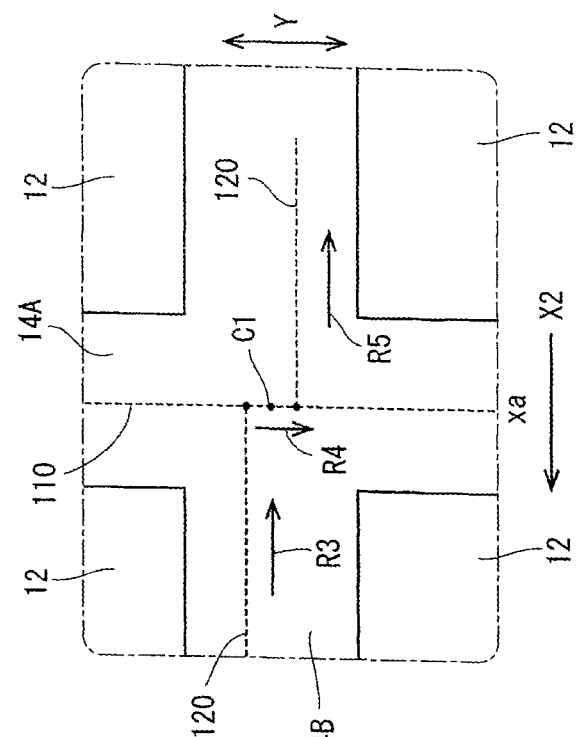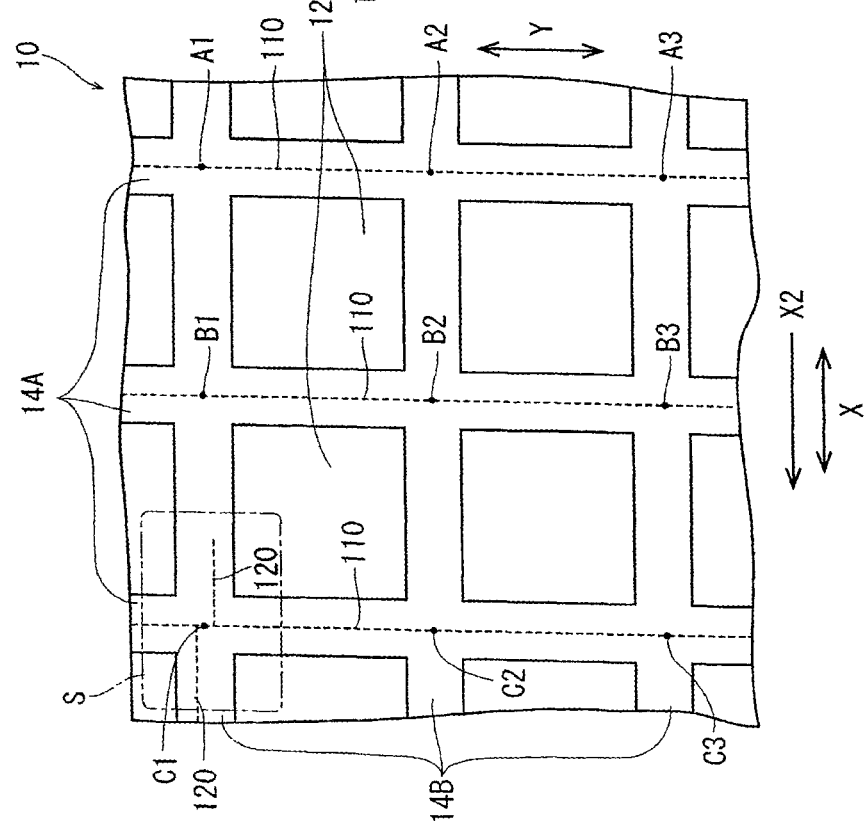

METHOD OF PROCESSING WAFER AND PROCESSING APPARATUS FOR WAFER

BACKGROUND OF THE INVENTION

Field of the Invention

The present invention relates to a method of processing a wafer and a processing apparatus for a wafer including a plurality of devices formed in respective areas on a face side thereof that are demarcated by a plurality of projected dicing lines extending in a first direction and a plurality of projected dicing lines extending in a second direction across the projected dicing lines extending in the first direction to divide the wafer into individual device chips.

Description of the Related Art

Wafers in which a plurality of devices such as integrated circuits (ICs) and large-scale integrated circuits (LSIs) are formed in respective areas on their face sides that are demarcated by a plurality of intersecting projected dicing lines are divided into individual device chips by a laser processing apparatus. The device chips thus divided will be used in electric equipment including a mobile phone, a personal computer, and the like.

The laser processing apparatus includes a chuck table for holding a wafer thereon and a laser beam applying unit for processing the wafer held on the chuck table with a laser beam. The laser beam applying unit applies the laser beam, which has a wavelength transmittable through the wafer, to the wafer while keeping the focused spot of the laser beam positioned inside the wafer along the projected dicing lines, thereby forming modified layers in the wafer in alignment with the projected dicing lines. Thereafter, external forces are exerted on the wafer to divide the wafer into individual device chips along the projected dicing lines (see, for example, Japanese patent No. 3408805).

SUMMARY OF THE INVENTION

Specifically, in order to divide the wafer into the individual device chips by use of the laser processing apparatus described above, the laser beam whose wavelength is transmittable through the wafer is applied to the wafer while the focused spot of the laser beam is being positioned inside the wafer along those of the projected dicing lines that extend in the first direction, thereby forming first modified layers inside the wafer in alignment with the projected dicing lines extending in the first direction. Then, the laser beam is applied to the wafer while the focused spot of the laser beam is being positioned inside the wafer along those of the projected dicing lines that extend in the second direction across the first direction, thereby forming second modified layers inside the wafer in alignment with the projected dicing lines extending in the second direction. Thereafter, external forces are exerted on the wafer to divide the wafer into individual device chips along the projected dicing lines. When the external forces are exerted on the wafer to divide the wafer into individual device chips, corners of the device chips are liable to rub against each other and be chipped at points where the first modified layers and the second modified layers extend across each other, tending to result in a reduction in the quality of the device chips.

It is therefore an object of the present invention to provide a method of processing a wafer and a processing apparatus for a wafer to produce individual device chips by dividing the wafer, the device chips having an acceptable level of quality maintained by preventing corners of the device chips from rubbing against each other and being chipped at points on the wafer where projected dicing lines extending in a first direction and projected dicing lines extending in a second direction across the first direction extend across each other, when the wafer is divided into the individual device chips.

In accordance with an aspect of the present invention, there is provided a method of processing a wafer including a plurality of devices formed in respective areas on a face side thereof that are demarcated by a plurality of projected dicing lines extending in a first direction and a plurality of projected dicing lines extending in a second direction across the projected dicing lines extending in the first direction, to divide the wafer into individual device chips. The method includes a first modified layer forming step of applying a laser beam having a wavelength transmittable through the wafer to the wafer while positioning a focused spot of the laser beam inside the wafer along the projected dicing lines extending in the first direction, thereby forming first modified layers in the wafer along the projected dicing lines extending in the first direction and a second modified layer forming step of, after the first modified layer forming step is performed, applying a laser beam having a wavelength transmittable through the wafer to the wafer while positioning a focused spot of the laser beam inside the wafer along the projected dicing lines extending in the second direction intersecting with the first direction, thereby forming second modified layers in the wafer along the projected dicing lines extending in the second direction. In the second modified layer forming step, when the focused spot of the laser beam applied to the wafer along the projected dicing lines extending in the second direction reaches the first modified layers, the focused spot of the laser beam is shifted along the first modified layers to thereby undulate the laser beam in a staggered pattern to prevent the second modified layers from being formed straight in the wafer along the projected dicing lines extending in the second direction.

Preferably, in the second modified layer forming step, the laser beam is undulated in the staggered pattern by use of either one of a spatial light modulator, an acousto-optic device, a diffractive optical element, a galvanoscanner, and a resonant scanner.

In accordance with another aspect of the present invention, there is provided a laser processing apparatus including a chuck table for holding a wafer thereon, a laser beam applying unit for applying a laser beam to the wafer held on the chuck table, a feed mechanism for processing-feeding the chuck table and the laser beam applying unit relatively to each other, and a control unit. The laser beam applying unit includes a laser oscillator for oscillating pulsed laser and emitting a pulsed laser beam, a beam condenser including an fθ lens and converging the laser beam emitted from the laser oscillator and applying the converged laser beam to the wafer held on the chuck table, and undulating means disposed between the laser oscillator and the beam condenser and undulating the laser beam in a staggered pattern within a width of each of the projected dicing lines extending in the second direction, and the control unit performs a control process for applying a laser beam having a wavelength transmittable through the wafer to the wafer while positioning a focused spot of the laser beam inside the wafer along the projected dicing lines extending in the first direction, thereby forming first modified layers in the wafer along the projected dicing lines extending in the first direction, performs a control process for storing coordinates where the first modified layers are formed and applying a laser beam having a wavelength transmittable through the wafer to the wafer while positioning a focused spot of the laser beam inside the wafer along the projected dicing lines extending in the second direction intersecting with the first direction, thereby forming second modified layers in the wafer along the projected dicing lines extending in the second direction, and when the focused spot of the laser beam applied to the wafer along the projected dicing lines extending in the second direction reaches the coordinates of the first modified layers, energizes the undulating means to shift the focused spot of the laser beam along the first modified layers to thereby undulate the laser beam in the staggered pattern to prevent the second modified layers from being formed straight in the wafer along the projected dicing lines extending in the second direction.

Preferably, the undulating means includes either one of a spatial light modulator, an acousto-optic device, a diffractive optical element, a galvanoscanner, and a resonant scanner.

With the method of processing a wafer according to the present invention, the second modified layers are undulated in the staggered fashion at the points where the projected dicing lines in the first direction and the projected dicing lines in the second direction intersect with each other. When external forces are exerted on the wafer to divide the wafer into individual device chips, corners of the device chips are prevented from rubbing against each other and being chipped at the points where the first modified layers and the second modified layers intersect with each other, so that the device chips are free from the problem of a reduction in their quality.

With the laser processing apparatus according to the present invention, when the focused spot of the laser beam applied to the wafer along the projected dicing lines extending in the second direction reaches the coordinates of the first modified layers, the control unit energizes the undulating means to shift the focused spot of the laser beam along the first modified layers to thereby undulate the laser beam in the staggered pattern to prevent the second modified layers from being formed straight in the wafer along the projected dicing lines extending in the second direction. Also when external forces are exerted on the wafer to divide the wafer into individual device chips, corners of the device chips are prevented from rubbing against each other and being chipped at the points where the first modified layers and the second modified layers intersect with each other, so that the device chips are free from the problem of a reduction in their quality.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 4A is an enlarged fragmentary plan view of the wafer at a time at which a first modified layer forming step is carried out thereon;

FIG. 4B is an enlarged fragmentary plan view of the wafer at a time at which the first modified layer forming step is carried out thereon;

FIG. 5A is an enlarged fragmentary plan view of the wafer at a time at which a second modified layer forming step is carried out thereon;

FIG. 5B is an enlarged fragmentary plan view of a section S illustrated in FIG. 5A.

DETAILED DESCRIPTION OF THE PREFERRED EMBODIMENT

A method of processing a wafer and a laser processing apparatus suitable for performing the method according to a preferred embodiment of the present invention will be described in detail hereinbelow with reference to the accompanying drawings.

Figure 1:
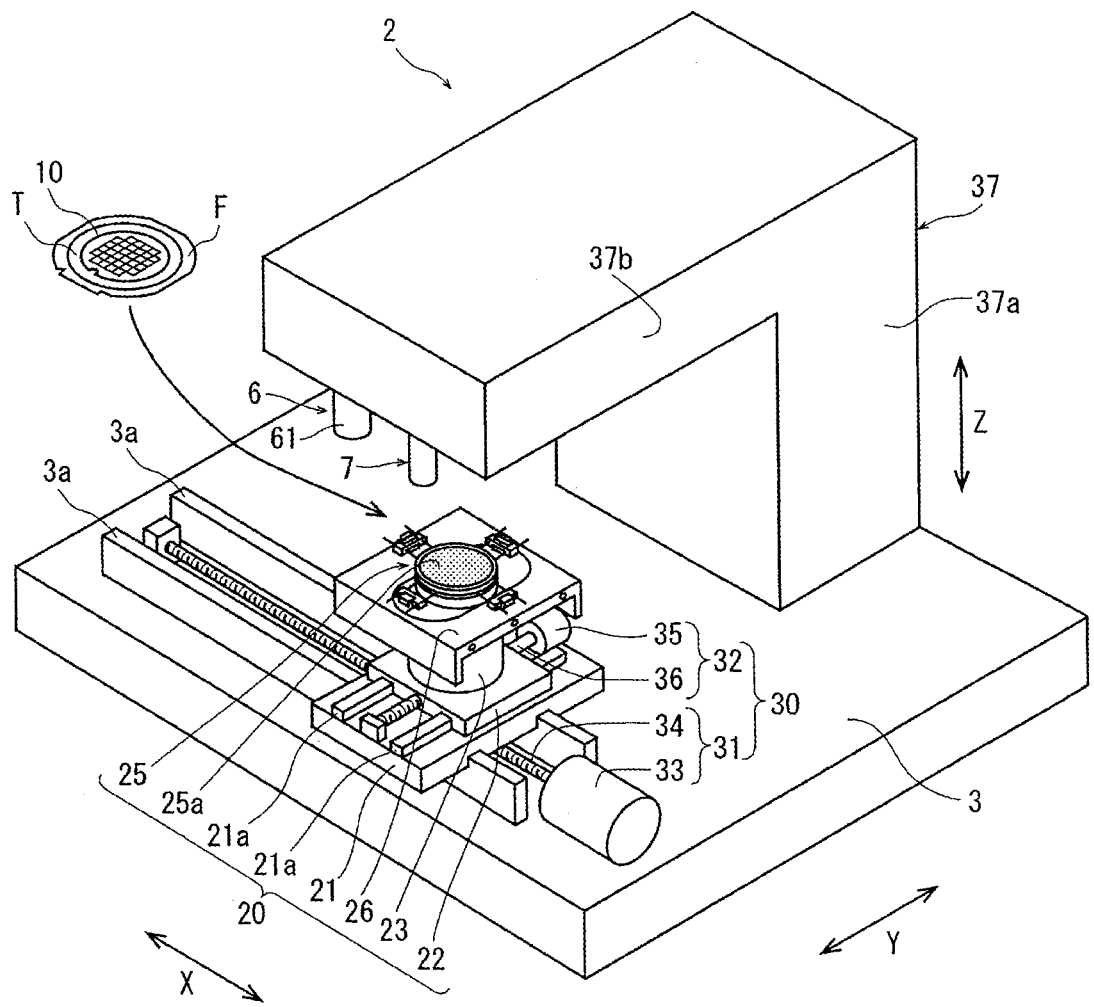
FIG. 1 is a perspective view of a laser processing apparatus according to an embodiment of the present invention.

FIG. 1 illustrates in perspective a laser processing apparatus 2 according to the present embodiment. As illustrated in FIG. 1, a workpiece to be processed by the laser processing apparatus 2 according to the present embodiment includes a wafer 10 shaped as a circular plate and held on an annular frame F by an adhesive tape T (see also FIG. 2A) interposed therebetween.

The laser processing apparatus 2 includes at least a chuck table 25 for holding the wafer 10 thereon, a laser beam applying unit 6 for applying a laser beam to the wafer 10 held on the chuck table 25 to process the wafer 10 with the laser beam, a feed mechanism 30 for processing-feeding the chuck table 25 and the laser beam applying unit 6 relatively to each other, and a control unit 100 (see FIG. 3) for controlling operable components of the laser processing apparatus 2 that include the laser beam applying unit 6 and the feed mechanism 30.

The chuck table 25 is included in a holding unit 20. The holding unit 20 includes a rectangular X-axis movable plate 21 movably mounted on a base 3 for movement in X-axis directions along a pair of guide rails 3a on the base 3, a rectangular Y-axis movable plate 22 movably mounted on the X-axis movable plate 21 for movement in Y-axis directions along a pair of guide rails 21a on the X-axis movable plate 21, a hollow cylindrical support post 23 fixed on an upper surface of the Y-axis movable plate 22, and a rectangular cover plate 26 fixed to an upper end of the support post 23. The chuck table 25 includes a circular plate extending upwardly through an oblong hole defined in the cover plate 26 and is rotatable about its vertical central axis by rotary actuator means, not depicted. The chuck table 25 has a holding surface 25a made of an air-permeable porous material and lying in a plane defined by the X-axis directions and the Y-axis directions. The holding surface 25a is held in fluid communication with suction means, not depicted, through a fluid channel, not depicted, defined in and extending through the support post 23. The X-axis directions represent directions indicated by the arrow X in FIG. 1, and the Y-axis directions represent directions indicated by the arrow Y in FIG. 1 and extending perpendicularly to the X-axis directions. The plane defined by the X-axis directions and the Y-axis directions lies essentially horizontally. Z-axis directions represent vertical directions indicated by the arrow Z in FIG. 1 and extending perpendicularly to the X-axis directions and the Y-axis directions.

The feed mechanism 30 includes an X-axis moving mechanism 31 for moving the chuck table 25 of the holding unit 20 and a laser beam emitted from the laser beam applying unit 6 relatively to each other in the X-axis directions, and a Y-axis moving mechanism 32 for moving the chuck table 25 and the laser beam emitted from the laser beam applying unit 6 relatively to each other in the Y-axis directions. The X-axis moving mechanism 31 has a ball screw 34 extending in the X-axis directions over the base 3 and an electric motor 33 coupled to an end of the ball screw 34. The ball screw 34 is operatively threaded through a nut, not depicted, mounted on a lower surface of the X-axis movable plate 21. When the electric motor 33 is energized, it rotates the ball screw 34 about its central axis, and the nut converts the rotary motion of the ball screw 34 into linear motion that is transmitted to the X-axis movable plate 21, moving the X-axis movable plate 21 in one or the other of the X-axis directions along the pair of guide rails 3a on the base 3. The Y-axis moving mechanism 32 has a ball screw 36 extending in the Y-axis directions over the X-axis movable plate 21 and an electric motor 35 coupled to an end of the ball screw 36. The ball screw 36 is operatively threaded through a nut, not depicted, mounted on a lower surface of the Y-axis movable plate 22. When the electric motor 35 is energized, it rotates the ball screw 36 about its central axis, and the nut converts the rotary motion of the ball screw 36 into linear motion that is transmitted to the Y-axis movable plate 22, moving the Y-axis movable plate 22 in one or the other of the Y-axis directions along the guide rails 21a on the X-axis movable plate 21.

The laser processing apparatus 2 further includes a frame 37 erected from the base 3 at a position behind the holding unit 20. The frame 37 includes a vertical wall 37a extending upwardly, i.e., in one of the Z-axis directions, from an upper surface of the base 3 and a horizontal arm 37b extending horizontally, i.e., in one of the Y-axis directions, from an upper end of the vertical wall 37a. The horizontal arm 37b incorporates therein the laser beam applying unit 6 and an image capturing unit 7 to be used in an alignment step. The laser beam applying unit 6 includes a beam condenser 61 disposed on a lower surface of the distal end of the horizontal arm 37b. The image capturing unit 7 is disposed at a position spaced from the beam condenser 61 in the X-axis directions. The laser beam applying unit 6 includes means for applying a pulsed laser beam having a wavelength transmittable through the wafer 10, and is set in operation to laser processing conditions for forming modified layers in the wafer 10 along projected dicing lines 14 thereon. The laser beam applying unit 6, the image capturing unit 7, the feed mechanism 30, and the like which have been described above are electrically connected to the control unit 100 described below, and controlled by instruction signals sent from the control unit 100 to perform a laser processing operation on the wafer 10.

Figure 2A:
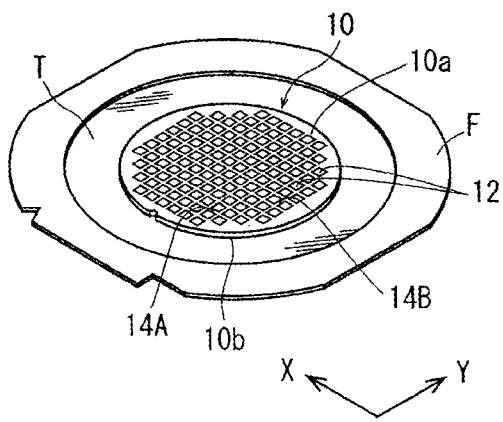
FIG. 2A is a perspective view of a wafer, with its face side facing up, to be processed by the laser processing apparatus illustrated in FIG. 1.
Figure 2B:
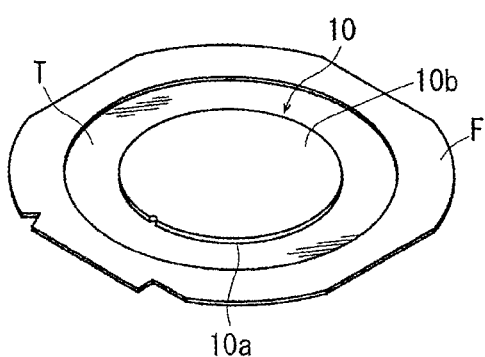
FIG. 2B is a perspective view of the wafer, with its reverse side facing up.

FIGS. 2A and 2B illustrate in more specific detail the wafer 10 to be processed by the laser processing apparatus 2 according to the present embodiment. As understood in FIG. 2A, the wafer 10 to be processed by the laser processing apparatus 2 according to the present embodiment has a plurality of devices 12 formed in respective areas on a face side 10a thereof that are demarcated by a plurality of projected dicing lines 14A extending in a first direction indicated by the arrow X and a plurality of projected dicing lines 14B extending in a second direction indicated by the arrow Y perpendicularly to the projected dicing lines 14A extending in the first direction. The wafer 10 is held on the annular frame F by the adhesive tape T interposed therebetween, with the face side 10a exposed upwardly and a reverse side 10b thereof facing downwardly and affixed centrally to the adhesive tape T. The wafer 10 includes a silicon substrate, for example. According to the present embodiment, the method of processing a wafer will be described below as being carried out in a manner to process the wafer 10 with the laser beam that is applied to the face side 10a of the wafer 10 as illustrated in FIG. 2A. However, the present invention is not limited to such processing details. The method of processing a wafer may alternatively be carried out in a manner to process the wafer 10 with the laser beam that is applied to the reverse side 10b of the wafer 10 as illustrated in FIG. 2B where the wafer 10 is held on the annular frame F by the adhesive tape T interposed therebetween, with the reverse side 10b exposed upwardly and the face side 10a facing downwardly and affixed centrally to the adhesive tape T.

Figure 3:
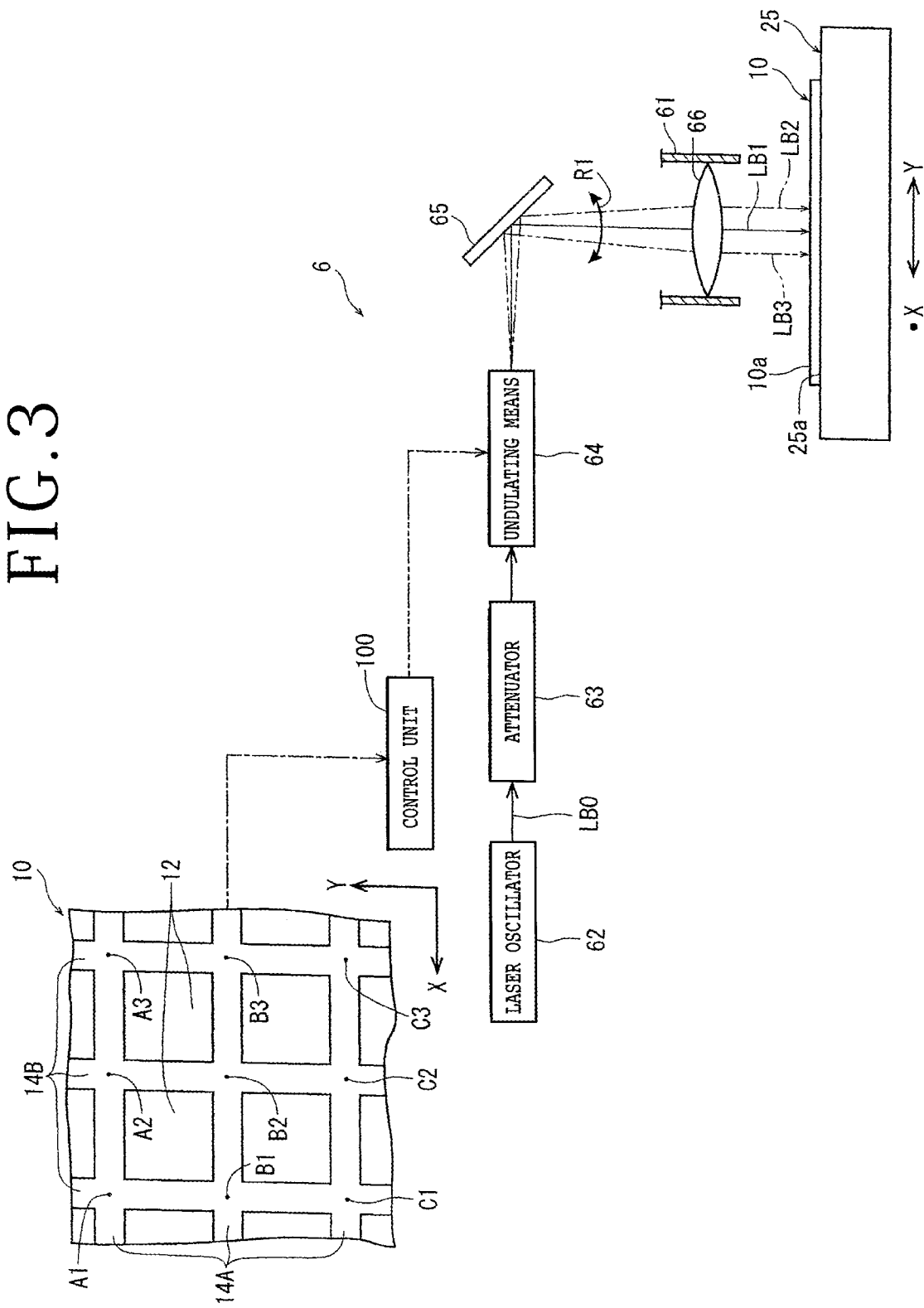
FIG. 3 is a block diagram of an optical system of a laser beam applying unit incorporated in the laser processing apparatus illustrated in FIG. 1.

An optical system of the laser beam applying unit 6 incorporated in the laser processing apparatus 2 according to the present embodiment will be described below with reference to FIG. 3. The laser beam applying unit 6 illustrated in FIG. 3 includes at least a laser oscillator 62 for oscillating pulsed laser and emitting a pulsed laser beam LB0, a beam condenser 61 including an fθ lens 66 for converging the pulsed laser beam LB0 emitted from the laser oscillator 62 and applying the converted pulsed laser beam to the wafer 10 held on the chuck table 25, and undulating means 64 disposed between the laser oscillator 62 and the beam condenser 61 for undulating the pulsed laser beam on the face side 10a of the wafer 10. According to the present embodiment, the laser beam applying unit 6 also includes an attenuator 63 disposed between the laser oscillator 62 and the undulating means 64 for regulating the output power of the pulsed laser beam LB0 emitted from the laser oscillator 62 and a reflecting mirror 65 for reflecting the pulsed laser beam LB0 from the undulating means 64 toward the beam condenser 61.

The undulating means 64 will be described in greater detail below. The undulating means 64 can include a spatial light modulator (SLM), for example, for electrically modulating the pulsed laser beam LB0 emitted from the laser oscillator 62 to the undulating means 64 to control the wave front configuration of the pulsed laser beam LB0 at a high speed as desired. Specifically, the undulating means 64 can be used to shift the pulsed laser beam LB0 sideways so that the pulsed laser beam reflected by the reflecting mirror 65 can be shifted in the directions indicated by the arrow R1 in FIG. 3 to thereby shift the position where the pulsed laser beam LB0 is applied to the wafer 10 on the chuck table 25 to different positions LB1, LB2, and LB3 in the Y-axis directions of the wafer 10, for example. The undulating means 64 is not limited to a spatial light modulator and can include an acousto-optic device (AOD), a diffractive optical element (DOE), a galvanoscanner, a resonant scanner, or the like. The functional and operational details of the undulating means 64 will be described in detail later.

The image capturing unit 7 includes illuminating means for illuminating the wafer 10 held on the chuck table 25, an ordinary image capturing device (CCD) for capturing images with a visible beam, infrared ray applying means for applying infrared rays to a workpiece, an optical system for catching infrared rays applied from the infrared ray applying means, and an image capturing device (infrared CCD) for outputting an electric signal representing infrared rays caught by the optical system, all not depicted.

The laser processing apparatus 2 according to the present embodiment has substantially structural details described above. The method of processing a wafer carried out by the laser processing apparatus 2 according to the present embodiment will be described below.

In preparation for the method of processing a wafer according to the present embodiment, the wafer 10 is delivered to the laser processing apparatus 2 and placed and held under suction on the chuck table 25 of the holding unit 20, as illustrated in FIG. 1. As described above with reference to FIG. 2A, the wafer 10 has the devices 12 formed in the respective areas on the face side 10a thereof that are demarcated by the projected dicing lines 14A extending in the first direction and the projected dicing lines 14B extending in the second direction perpendicular to the first direction. Each of the projected dicing lines 14A extending in the first direction and the projected dicing lines 14B extending in the second direction has a width of 50 μm. Then, the feed mechanism 30 is actuated to position the wafer 10 held on the chuck table 25 directly below the image capturing unit 7.

When the wafer 10 has been positioned directly below the image capturing unit 7, the rotary actuator means for rotating the chuck table 25 and the feed mechanism 30 are appropriately actuated, and the image capturing unit 7 is energized to capture images of the face side 10a of the wafer 10 positioned directly below the image capturing unit 7. Then, the XY coordinates of the positions of the projected dicing lines 14A extending in the first direction and the projected dicing lines 14B extending in the second direction on the face side 10a of the wafer 10 are detected from the captured images. At the same time, as illustrated in FIG. 3, the XY coordinates of the centers A1 through A3, B1 through B3, C1 through C3 of points where the projected dicing lines 14A and the projected dicing lines 14B intersect with each other are also detected. The detected XY coordinates are stored in a coordinate storage section, not depicted, of the control unit 100. In FIG. 3, only a portion of the face side 10a of the wafer 10 is illustrated for illustrative purposes. Actually, however, the XY coordinates of the positions of all the projected dicing lines 14A and the projected dicing lines 14B which are formed on the face side 10a of the wafer 10 and the XY coordinates of the centers of all the points where the projected dicing lines 14A and the projected dicing lines 14B intersect with each other are detected and stored in the coordinate storage section (alignment step). In a case where the wafer 10 with the reverse side 10b facing upwardly as illustrated in FIG. 2B is to be processed as a workpiece, the infrared ray applying means and the infrared CCD of the image capturing unit 7 are energized to capture infrared images of the projected dicing lines 14A and the projected dicing lines 14B on the face side 10a facing downwardly from above the reverse side 10b of the wafer 10, and the XY coordinates of the positions of the projected dicing lines 14A and the projected dicing lines 14B and the XY coordinates of the points where they intersect with each other are detected from the captured infrared images.

Then, the feed mechanism 30 and the rotary actuator means described above are actuated to move the chuck table 25 to align the projected dicing lines 14A in the first direction with the X-axis directions. Thereafter, the method of processing a wafer is carried out in the following description.

On the basis of the information of the XY coordinates of the positions of the projected dicing lines 14A in the first direction as detected in the alignment step described above, the chuck table 25 is moved to position the beam condenser 61 of the laser beam applying unit 6 directly above a processing start position on a predetermined one of the projected dicing lines 14A in the first direction on the wafer 10. At this time, the undulating means 64 illustrated in FIG. 3 has been set to transmit the pulsed laser beam LB0 emitted from the laser oscillator 62 straight through the undulating means 64 to the reflecting mirror 65, which reflects the pulsed laser beam LB0 downwardly as a laser beam LB1, indicated by the solid line in FIG. 3, traveling centrally through the fθ lens 66 of the beam condenser 61. As illustrated in FIG. 4A, the pulsed laser beam LB1 that has traveled through the fθ lens 66 is applied to the wafer 10 while its focused spot is being positioned inside the wafer 10 below the center of the projected dicing line 14A in the first direction. As the wafer 10 as well as the chuck table 25 is processing-fed in the direction indicated by the arrow X1, which is one of the X-axis directions, the pulsed laser beam LB1 is applied to the wafer 10 along the center of the projected dicing line 14A in the first direction, thereby processing the wafer 10 along the projected dicing line 14A to form a first modified layer 110 in the wafer 10 along the projected dicing line 14A.

After the first modified layer 110 has been formed in the wafer 10 along the projected dicing line 14A, the wafer 10 is indexing-fed in one of the Y-axis directions by a distance corresponding to the interval in the Y-axis directions between adjacent ones of the projected dicing lines 14A, positioning an unprocessed adjacent one of the projected dicing lines 14A directly below the beam condenser 61. Then, in the same manner as the processing cycle described above, the pulsed laser beam LB1 is applied to the wafer 10 while its focused spot is being positioned inside the wafer 10 below the center of the unprocessed adjacent projected dicing line 14A. As the wafer 10 is processing-fed in the direction indicated by the arrow X1 in FIG. 4A, the pulsed laser beam LB1 is applied to the wafer 10 along the center of the unprocessed adjacent projected dicing line 14A in the first direction, thereby processing the wafer 10 along the projected dicing line 14A to form another first modified layer 110 in the wafer 10 along the projected dicing line 14A. The above sequence is repeated to form first modified layers 110 in the wafer 10 along all the projected dicing lines 14A extending in the first direction (first modified layer forming step), as illustrated in FIG. 4B. The first modified layers 110 according to the present embodiment are formed in the wafer 10 as extending along and through the centers of the projected dicing lines 14A extending in the first direction, as viewed in plan. As illustrated in FIG. 4B, the first modified layers 110 also extend through the centers A1 through A3, B1 through B3, C1 through C3 of the points where the projected dicing lines 14A and the projected dicing lines 14B intersect with each other. The XY coordinates of the positions of all the first modified layers 110 formed in the wafer 10 are stored in the coordinate storage section, not depicted, of the control unit 100.

When the first modified layers 110 have been formed in the wafer 10 along all the projected dicing lines 14A in the first direction in the first modified layer forming step described above, the rotary actuator means is actuated to turn the chuck table 25 and hence the wafer 10 through 90 degrees in the direction indicated by the arrow R2 in FIG. 4B to bring the projected dicing lines 14A in the first direction and the first modified layers 110 into alignment with the Y-axis directions and also to bring the projected dicing lines 14B in the second direction perpendicular to the projected dicing lines 14A in the first direction into alignment with the X-axis directions. At this time, since the XY coordinates of the positions of the first modified layers 110 formed in the wafer 10 vary as the chuck table 25 is turned 90 degrees, the XY coordinates of the positions of the first modified layers 110 stored in the coordinate storage section of the control unit 100 are transformed into actual XY coordinates on the laser processing apparatus 2 by the control unit 100. The transformed XY coordinates of the positions of the first modified layers 110 are stored in the coordinate storage section of the control unit 100.

Then, the feed mechanism 30 described above is actuated to position a processing start position on a predetermined one of the projected dicing lines 14B in the second direction on the wafer 10 directly below the beam condenser 61 of the laser beam applying unit 6. When the pulsed laser beam emitted from the laser oscillator 62 is applied to the wafer 10 along the projected dicing line 14B in the second direction, the control unit 100 sends an instruction signal to energize the undulating means 64 to shift the pulsed laser beam LB0 to one side before reaching the reflecting mirror 65, which reflects the pulsed laser beam LB0 downwardly as a pulsed laser beam LB2, indicated by the dot-and-dash line in FIG. 3, traveling off-center through the fθ lens 66 of the beam condenser 61. In other words, the position of the focused spot of the pulsed laser beam LB2 in the wafer 10 is shifted from the position of the focused spot of the pulsed laser beam LB1 in the wafer 10 and stays in the projected dicing line 14B in the second direction. As illustrated in FIG. 5A, the pulsed laser beam LB2 that has traveled through the fθ lens 66 is applied to the wafer 10 while its focused spot is being positioned inside the wafer 10 on the projected dicing line 14B in the second direction. As the wafer 10 is processing-fed in the direction indicated by the arrow X2 in FIG. 5A, the pulsed laser beam LB2 is applied to the wafer 10 along the projected dicing line 14B in the second direction, thereby processing the wafer 10 along the projected dicing line 14B to form a second modified layer 120 in the wafer 10 along the projected dicing line 14B in the second direction. The formation of the second modified layer 120 in the wafer 10 along the projected dicing line 14B will be described in greater detail below with reference to FIG. 5B which is an enlarged fragmentary plan view of a section S illustrated in FIG. 5A where the second modified layer 120 is formed.

As illustrated in FIG. 5B, the position where the second modified layer 120 is to be formed up to the first modified layer 110 is not along the center of the projected dicing line 14B in the second direction, but along a line shifted toward one of two opposite devices 12, i.e., the upper device 120 illustrated in FIG. 5B according to the present embodiment, by a distance of 10 μm, for example, from the center of the projected dicing line 14B. Then, as the wafer 10 is processing-fed in the direction indicated by the arrow X2, the pulsed laser beam LB2 is applied to the wafer 10 to form the second modified layer 120 along the projected dicing line 14B in the wafer 10 in the direction indicated by the arrow R3. When the focused spot of the pulsed laser beam LB2 has reached the X coordinate xa of the first modified layer 110, the undulating means 64 is energized to shift the pulsed laser beam LB0 to the other side before reaching the reflecting mirror 65, which reflects the pulsed laser beam LB0 downwardly as a laser beam LB3, indicated by the two-dot-and-dash line in FIG. 3, traveling off-center through the fθ lens 66 of the beam condenser 61. The position of the focused spot of the pulsed laser beam LB3 in the wafer 10 is shifted from the position of the focused spot of the pulsed laser beam LB2 in the wafer 10 in the direction indicated by the arrow R4 in FIG. 5B by a distance of 20 μm, for example, and stays in the projected dicing line 14B in the second direction. Specifically, the focused spot of the pulsed laser beam LB3 is shifted across a central point C1 to a position spaced 10 μm from the central point C1. The pulsed laser beam LB3 that has traveled through the fθ lens 66 is applied to the wafer 10 while its focused spot is being positioned inside the wafer 10 on the projected dicing line 14B in the second direction. As the wafer 10 is processing-fed in the direction indicated by the arrow X2 in FIG. 5B, the pulsed laser beam LB2 is applied to the wafer 10 along the projected dicing line 14B in the second direction, thereby processing the wafer 10 along the projected dicing line 14B to form a second modified layer 120 in the wafer 10 along the projected dicing line 14B in the second direction. In this manner, the pulsed laser beam applied to the wafer 10 is undulated in a staggered pattern to prevent the second modified layer 120 from being formed straight in the wafer 10 along the projected dicing line 14B, but to form the second modified layer 120 in the direction indicated by the arrow R3 and then in the direction indicated by the arrow R5.

Figure 6:
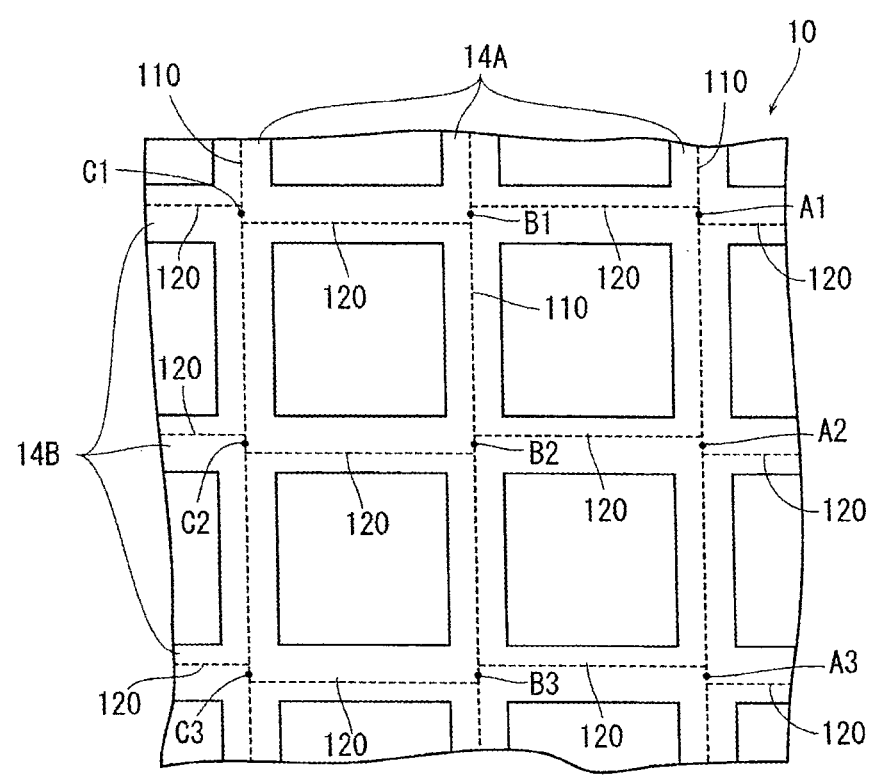
FIG. 6 is an enlarged fragmentary plan view of the wafer at a time at which the second modified layer forming step has been completed.

The undulating means 64 described above is adjusted in its operation each time the focused spot of the pulsed laser beam reaches the first modified layer 110 to form the second modified layer 120 undulated in the staggered pattern within the width of the projected dicing line 14B in the second direction, as illustrated in FIG. 6. After the second modified layer 120 has been formed in the wafer 10 along the projected dicing line 14B in the second direction, as described above, the wafer 10 is indexing-fed in one of the Y-axis directions by a distance corresponding to the interval in the Y-axis directions between adjacent ones of the projected dicing lines 14A, positioning an unprocessed adjacent one of the projected dicing lines 14B directly below the beam condenser 61. Then, in the same manner as the processing cycle described above, the pulsed laser beam is applied to the wafer 10 while its focused spot is being positioned inside the wafer 10 below the unprocessed adjacent projected dicing line 14B. As the wafer 10 is processing-fed, the pulsed laser beam is applied to the wafer 10 along the unprocessed adjacent projected dicing line 14B in the second direction, thereby processing the wafer 10 along the projected dicing line 14B to form another staggered second modified layer 120 in the wafer 10 along the projected dicing line 14B. The above sequence is repeated to form staggered second modified layers 120 in the wafer 10 along all the projected dicing lines 14B extending in the second direction (second modified layer forming step), as illustrated in FIG. 6.

Laser processing conditions in the first modified layer forming step and the second modified layer forming step which have been described above are established as follows, for example:

Wavelength: 1342 nm
Average output power: 1.0 W
Repetitive frequency: 90 kHz
Processing-feed speed: 700 mm/second After the first modified layers 110 have been formed in the wafer 10 along the projected dicing lines 14A in the first direction and the second modified layers 120 have been formed in the staggered pattern in the wafer 10 along the projected dicing lines 14B in the second direction, as described above, the wafer 10 is delivered to expanding means, not depicted. The expanding means applies external forces to the adhesive tape T to which the wafer 10 is affixed, expanding the adhesive tape T horizontally to divide the wafer 10 into individual device chips along the first modified layers 110 and second modified layers 120.

According to the embodiment described above, the second modified layers 120 are undulated in the staggered pattern at the points where the projected dicing lines 14A in the first direction and the projected dicing lines 14B in the second direction intersect with each other. Therefore, when external forces are exerted on the wafer 10 to divide the wafer into individual device chips, corners of the device chips are prevented from rubbing against each other and being chipped at the points where the first modified layers 110 and the second modified layers 120 intersect with each other, so that the device chips are free from the problem of a reduction in their quality.

The present invention is not limited to the embodiment described above. For example, according to the above embodiment, the first modified layers 110 are formed in the wafer 10 as extending along and through the centers of the projected dicing lines 14A extending in the first direction. However, the first modified layers 110 may not necessarily be formed as extending through the centers of the projected dicing lines 14A, but may be shifted sideways from the centers of the projected dicing lines 14A. According to the above embodiment, furthermore, after the first modified layers 110 and the second modified layers 120 have been formed in the wafer 10, the adhesive tape T to which the wafer 10 is affixed is horizontally expanded to divide the wafer 10 into individual device chips. However, the present invention is not limited to such details. Instead, a roller or the like may be pressed against the face side 10a of the wafer 10 to apply external forces to the wafer 10 to thereby divide the wafer 10 into individual device chips.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer including a plurality of devices formed in respective areas on a face side thereof that are demarcated by a plurality of projected dicing lines extending in a first direction and a plurality of projected dicing lines extending in a second direction across the projected dicing lines extending in the first direction, to divide the wafer into individual device chips, comprising:

a first modified layer forming step of applying a laser beam having a wavelength transmittable through the wafer to the wafer while positioning a focused spot of the laser beam inside the wafer along the projected dicing lines extending in the first direction, thereby forming first modified layers in the wafer along the projected dicing lines extending in the first direction; and a second modified layer forming step of, after the first modified layer forming step is performed, applying a laser beam having a wavelength transmittable through the wafer to the wafer while positioning a focused spot of the laser beam inside the wafer along the projected dicing lines extending in the second direction intersecting with the first direction, thereby forming second modified layers in the wafer along the projected dicing lines extending in the second direction, wherein, in the second modified layer forming step, when the focused spot of the laser beam applied to the wafer along the projected dicing lines extending in the second direction reaches the first modified layers, the focused spot of the laser beam is shifted along the first modified layers to thereby undulate the laser beam in a staggered pattern to prevent the second modified layers from being formed straight in the wafer along the projected dicing lines extending in the second direction.

2. The method of processing a wafer according to claim 1, wherein, in the second modified layer forming step, the laser beam is undulated in the staggered pattern by use of either one of a spatial light modulator, an acousto-optic device, a diffractive optical element, a galvanoscanner, and a resonant scanner.

3. The laser processing apparatus according to claim 1, further comprising a step of taking images of the wafer and obtaining XY coordinates of: the projected dicing lines extending in the first direction, the projected dicing lines extending in the second direction and centers of points where the projected dicing lines extending in the first direction and the projected dicing lines extending the second direction intersect each other, from the images and storing the XY coordinates in a coordinate storage section of a control unit.

* * * * *